(12) United States Patent
Tsuruta et al.

(10) Patent No.: US 11,680,332 B2
(45) Date of Patent: Jun. 20, 2023

(54) SURFACE-TREATED COPPER FOIL, AND COPPER-CLAD LAMINATE AND CIRCUIT BOARD USING SAME

(71) Applicants: FURUKAWA ELECTRIC CO., LTD., Tokyo (JP); MURATA MANUFACTURING CO., LTD., Nagaokakyo (JP)

(72) Inventors: Takahiro Tsuruta, Tokyo (JP); Takeo Uno, Tokyo (JP); Yuko Okuno, Tokyo (JP); Sunao Fukutake, Nagaokakyo (JP); Yoshimasa Nishi, Nagaokakyo (JP)

(73) Assignees: Furukawa Electric Co., Ltd., Tokyo (JP); Murata Manufacturing Co., Ltd., Nagaokakyo (JP)

( * ) Notice: Subject to any disclaimer, the term of this patent is extended or adjusted under 35 U.S.C. 154(b) by 90 days.

(21) Appl. No.: 17/211,400

(22) Filed: Mar. 24, 2021

(65) Prior Publication Data

US 2021/0212204 A1 Jul. 8, 2021

Related U.S. Application Data

(63) Continuation of application No. PCT/JP2019/036596, filed on Sep. 18, 2019.

(30) Foreign Application Priority Data

Sep. 28, 2018 (JP) .............................. JP2018-184302

(51) Int. Cl.
*B32B 15/08* (2006.01)
*C25D 3/38* (2006.01)
(Continued)

(52) U.S. Cl.
CPC .............. *C25D 5/605* (2020.08); *B32B 5/024* (2013.01); *B32B 15/08* (2013.01); *B32B 15/14* (2013.01);
(Continued)

(58) Field of Classification Search
None
See application file for complete search history.

(56) References Cited

U.S. PATENT DOCUMENTS

| 2004/0043242 | A1 | 3/2004 | Nakaoka et al. |
| 2015/0245477 | A1* | 8/2015 | Arai ...................... C25D 7/0692 428/209 |
| 2018/0288884 | A1* | 10/2018 | Ori .......................... C25D 5/48 |

FOREIGN PATENT DOCUMENTS

| JP | 2004-119961 A | 4/2004 |
| JP | 2014-194067 A | 10/2014 |
| WO | 2017/179416 A1 | 10/2017 |

OTHER PUBLICATIONS

International Search Report (with partial translation) and Written Opinion dated Nov. 19, 2019, issued in corresponding International Patent Application PCT/JP2019/036596.
(Continued)

*Primary Examiner* — Seth Dumbris
(74) *Attorney, Agent, or Firm* — Morgan, Lewis & Bockius LLP

(57) ABSTRACT

Provided is a surface-treated copper foil excellent in laser processability. The surface-treated copper foil includes a roughened surface formed by subjecting a surface to a roughening treatment, in which when measured using a three-dimensional roughness meter, the roughened surface has a surface skewness Ssk within a range of from −0.300

(Continued)

to less than 0 and an arithmetic mean summit curvature Ssc within a range of from 0.0220 $nm^{-1}$ to less than 0.0300 $nm^{-1}$.

10 Claims, 1 Drawing Sheet

(51) Int. Cl.

| | |
|---|---|
| C25D 5/00 | (2006.01) |
| B32B 5/02 | (2006.01) |
| B32B 15/14 | (2006.01) |
| B32B 15/18 | (2006.01) |
| B32B 15/20 | (2006.01) |
| C25D 7/06 | (2006.01) |
| H05K 1/05 | (2006.01) |
| C25D 1/04 | (2006.01) |

(52) U.S. Cl.
CPC .............. *B32B 15/18* (2013.01); *B32B 15/20* (2013.01); *C25D 3/38* (2013.01); *C25D 7/0614* (2013.01); *H05K 1/056* (2013.01); *B32B 2262/103* (2013.01); *B32B 2307/538* (2013.01); *B32B 2457/08* (2013.01); *C25D 1/04* (2013.01); *H05K 2201/0141* (2013.01); *H05K 2201/0358* (2013.01)

(56) References Cited

OTHER PUBLICATIONS

Office Action dated Dec. 1, 2020, issued in corresponding Japanese Patent Application No. 2018-184302.

* cited by examiner

SURFACE-TREATED COPPER FOIL, AND COPPER-CLAD LAMINATE AND CIRCUIT BOARD USING SAME

CROSS-REFERENCE TO RELATED APPLICATION

This application is a continuation application filed under 35 U.S.C. § 111(a) of International Patent Application No. PCT/JP2019/036596, filed on Sep. 18, 2019, the contents of which are incorporated herein by reference.

TECHNICAL FIELD

The present invention relates to a surface-treated copper foil. Furthermore, the present invention relates to a copper-clad laminate and a circuit board using the surface-treated copper foil.

BACKGROUND ART

A surface-treated copper foil including a roughened surface formed by subjecting a surface to a roughening treatment is used, for example, as a material for circuit boards. Additionally, the surface-treated copper foil is required to have adhesion to resin (hereinafter referred to as "resin adhesion") for use in manufacturing of a circuit board, and the manufactured circuit board is required to have signal (for example, high frequency signal) transmission characteristics.

PTL 1 discloses a surface-treated copper foil including a roughened surface having an arithmetic mean peak curvature Spc of 55 mm$^{-1}$ or more and a printed wiring board manufactured using the surface-treated copper foil, and states that the surface-treated copper foil is excellent in resin adhesion. Additionally, PTL 2 discloses a copper foil with a carrier in which a roughened surface of an ultrathin copper layer has a surface skewness Ssk within a range of from −0.3 to 0.3, and states that the copper foil with a carrier is excellent in fine pitch formability.

CITATION LIST

Patent Literature

PTL 1: WO 2017/179416
PTL 2: JP 2014-194067 A

SUMMARY OF INVENTION

Technical Problem

However, surface-treated copper foils are required to have, besides excellency in resin adhesion, properties such that when manufacturing a circuit board, a resin (for example, liquid crystal polymer) adherent to the roughened surface of the surface-treated copper foil is easily removable from the roughened surface by laser light irradiation (hereinafter referred to as "laser processability").

It is an object of the present invention to provide a surface-treated copper foil excellent in laser processability. It is another object of the present invention to provide a copper-clad laminate and a circuit board that are easy to manufacture.

Solution to Problem

A surface-treated copper foil according to one aspect of the present invention is a surface-treated copper foil including a roughened surface formed by subjecting a surface to a roughening treatment, in which when measured using a three-dimensional roughness meter, the roughened surface has a surface skewness Ssk within a range of from −0.300 to less than 0 and an arithmetic mean summit curvature Ssc within a range of from 0.0220 nm$^{-1}$ to less than 0.0300 nm$^{-1}$.

In addition, a copper-clad laminate and a circuit board according to other aspects of the present invention include the surface-treated copper foil according to the above one aspect of the present invention.

Advantageous Effects of Invention

According to the present invention, the surface-treated copper foil is excellent in laser processability, and the copper-clad laminate and the circuit board are easy to manufacture.

DESCRIPTION OF EMBODIMENTS

An embodiment of the present invention will be described. It should be noted that the present embodiment is an example of the present invention, in which various changes or improvements can be added to the embodiment, and embodiments added with such changes or improvements can also be included within the scope of the present invention.

A surface-treated copper foil of the present embodiment is a surface-treated copper foil including a roughened surface formed by subjecting a surface to a roughening treatment, in which when measured using a three-dimensional roughness meter, the roughened surface has a surface skewness Ssk within a range of from −0.300 to less than 0 and an arithmetic mean summit curvature Ssc within a range of from 0.0220 nm$^{-1}$ to less than 0.0300 nm$^{-1}$.

Here, the surface skewness Ssk represents the degree of symmetry of surface heights about a mean plane, and is defined in the ISO 25178-2 (see a formula below). Additionally, the arithmetic mean summit curvature Ssc is a mean summit curvature for various peak structures (see a formula below).

$$Ssk = \frac{1}{S_q^3} \int\int_a (z(x, y))^3 dxdy \quad \text{[Math 1]}$$

$$Ssc = \frac{1}{N} \int\int_{Summit-Area} \left(\frac{\partial^2 z(x, y)}{\partial x^2}\right) + \left(\frac{\partial^2 z(x, y)}{\partial y^2}\right) dxdy \quad \text{[Math 2]}$$

In the above formulae, Sq represents a root mean square height, z(x, y) represents a coordinate in a height direction in x and y coordinates, and N represents the number of summits within a three-dimensional roughness measuring range.

Such a surface-treated copper foil of the present embodiment is excellent in resin adhesion and laser processability. Thus, the surface-treated copper foil of the present embodiment is suitable as a surface-treated copper foil for use in manufacturing of, for example, a copper-clad laminate such as a copper-clad laminate for high frequency transmission and a circuit board such as a circuit board for high frequency transmission.

Figure 1:
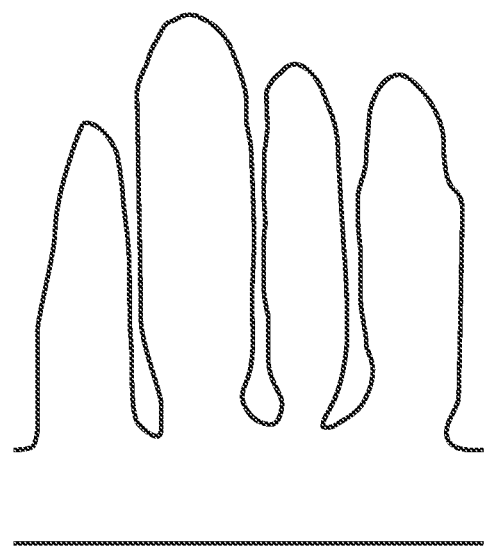
FIG. 1 is a cross-sectional diagram of a surface-treated copper foil including a roughened surface having a surface skewness Ssk ranging from −0.300 to less than 0.

When the surface skewness Ssk of the roughened surface measured using the three-dimensional roughness meter is within the range of from −0.300 to less than 0, laser processability is favorable. When the surface skewness Ssk falls within the range of from −0.300 to less than 0, the roughened surface has a structure with many fine valley structures between roughened particles, as illustrated in FIG. 1. In such a structure, laser light entering between the roughened particles is repeatedly reflected, which facilitates removal of even the resin (for example, liquid crystal polymer) adherent to portions near roots of the roughened particles, so that laser processability is excellent. However, when the surface skewness Ssk is less than −0.300, the valley structures between the roughened particles become too long and narrow, and thereby the laser light hardly reaches the roots of the roughened particles, which may reduce laser processability.

Figure 2:
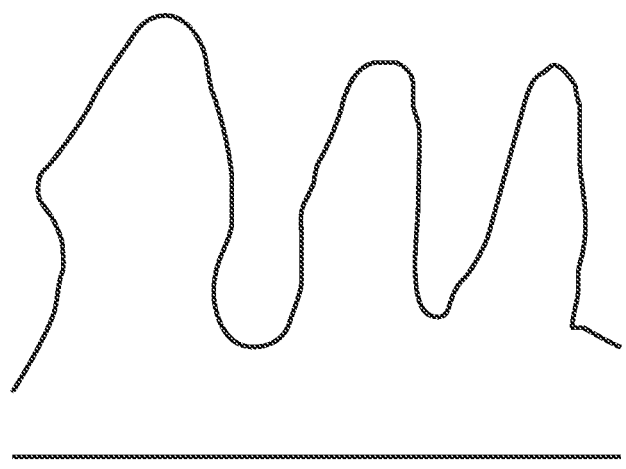
FIG. 2 is a cross-sectional diagram of a surface-treated copper foil including a roughened surface having a surface skewness Ssk of 0 or more.

On the other hand, when the surface skewness Ssk has a positive value (0 or more), the roughened surface has a structure in which long and narrow protruding portions are scattered on the roughened surface, as illustrated in FIG. 2. As a result, it is difficult to expect the repeated reflection of the applied laser light by the roughened particles, so that prolonged laser light irradiation is required to remove the resin adherent to the portions near the roots of the roughened particles, which may reduce laser processability.

To achieve excellent laser processability, the surface skewness Ssk of the roughened surface of the surface-treated copper foil needs to have a negative value (less than 0), which is preferably less than −0.100.

The surface skewness Ssk of the roughened surface of the surface-treated copper foil can be measured using a three-dimensional roughness meter such as, for example, a white light interference type three-dimensional roughness meter, for example, from a position perpendicular to the roughened surface.

Additionally, when the arithmetic mean summit curvature Ssc of the roughened surface measured using the three-dimensional roughness meter is 0.0220 $nm^{-1}$ or more, resin adhesion is favorable. In other words, controlling the summit curvature of the roughened surface ensures that favorable resin adhesion is obtained. The sharper the apexes (tips) of copper particles forming irregularities of the roughened surface, the easier it is for the tips of the copper particles to pierce the resin during manufacturing of, for example, a copper-clad laminate, thus improving anchoring effect to obtain favorable resin adhesion. To achieve excellent resin adhesion, the arithmetic mean summit curvature Ssc of the roughened surface of the surface-treated copper foil needs to be 0.0220 $nm^{-1}$ or more, but is preferably 0.0250 $nm^{-1}$ or more.

On the other hand, when the arithmetic mean summit curvature Ssc of the roughened surface measured using the three-dimensional roughness meter is less than 0.0300 $nm^{-1}$, powder falling that occurs due to breakage of the tips of the roughened particles can be suppressed. If the arithmetic mean summit curvature Ssc of the roughened surface is 0.0300 $nm^{-1}$ or more, the tips of the roughened particles become excessively sharp, due to which the tips thereof are easily broken and fall off. As a result, the broken tips remain between the copper foil and the resin during copper-clad lamination, which can lead to reduced reliability of the copper-clad laminate.

The above-described properties of the roughened surface of the surface-treated copper foil, i.e., the surface skewness Ssk and the arithmetic mean summit curvature Ssc can be controlled by adjusting conditions of roughening treatment during the process of manufacturing the surface-treated copper foil. For example, when the roughening treatment is plating, a dissimilar metal element different from copper can be added to a plating liquid in a plating tank to control the above properties of the roughened surface by the type and concentration of the dissimilar metal.

For example, adding an appropriate amount of scandium to the plating liquid for use in the roughening treatment can reduce the distance between sites generated by the roughened particles so that many finer valley structures are included between the roughened particles. Therefore, control can be made such that the surface skewness Ssk of the roughened surface has a negative value and the absolute value thereof becomes large. Additionally, adding an appropriate amount of molybdenum to the plating liquid for use in the roughening treatment can increase liquid resistivity of the plating liquid to reduce current efficiency, thereby enabling formation of long and narrow roughened particles having sharper tips. Therefore, control can be made such that the arithmetic mean summit curvature Ssc of the roughened surface has a large value.

The surface-treated copper foil of the present embodiment includes copper or copper alloy. Examples of kinds of the copper alloy include copper alloys containing at least one component of alloy components such as nickel, tin, zinc, lead, aluminum, manganese, titanium, iron, phosphorus, beryllium, cobalt, magnesium, chromium, and silicon. The copper or copper alloy may contain unavoidable impurities.

The surface-treated copper foil of the present embodiment is suitably used for manufacturing a copper-clad laminate. In addition, such a copper-clad laminate is suitably used for manufacturing a circuit board.

The copper-clad laminate of the present embodiment is formed using the surface-treated copper foil of the present embodiment described above. Such a copper-clad laminate of the present embodiment can be formed by a known method. For example, the copper-clad laminate can be manufactured by laminating and bonding a resin base material onto the roughened surface (a bonded surface) of the surface-treated copper foil of the present embodiment.

Here, as a resin for use in the resin base material, polymer resins including various components can be used. Phenol resin or epoxy resin can be mainly used for rigid wiring boards or printed wiring boards for semiconductor packages (PKGs). Polyimide or polyamide-imide can be mainly used for flexible boards. For fine pattern (high density) wiring boards or high frequency boards, heat-resistant resin having a high glass transition point (Tg) can be used as a material with high dimensional stability, a material with less warping and twisting, a material with low heat shrinkage, and the like. Examples of the heat-resistant resin include thermoplastic resins, such as liquid crystal polymer, polyether ether ketone, polyphenylene sulfide, polyphenylene ether, polyphenylene oxide, polyetherimide, polyether sulfone, polyethylene naphthalate, polyethylene terephthalate, and thermoplastic polyimide, or polymer alloys thereof and additionally thermosetting resins, such as polyimide, heat-resistant epoxy resins, cyanate-based resins such as bismaleimide triazine, and thermosetting modified polyphenylene ether. Particularly, the resin for use in the resin base material of the copper-clad laminate of the present embodiment is preferably a liquid crystal polymer. Because liquid crystal polymer is small in dielectric loss tangent and relative permittivity, a circuit board using liquid crystal polymer as resin base material has excellent signal transmission characteristics.

Hereinafter, a specific example of a method for manufacturing the copper-clad laminate will be described by exemplifying a case in which a liquid crystal polymer film is used as the resin base material.

Liquid crystal polymers include thermotropic liquid crystal polymers that exhibit liquid crystallinity in a molten state and rheotropic liquid crystal polymers that exhibit liquid crystallinity in a solution state. In the present embodiment, any liquid crystal polymer can be used. However, preferably, thermotropic liquid crystal polymer is suitably used from the viewpoint of being thermoplastic and having higher dielectric characteristics.

Among thermotropic liquid crystal polymers, thermotropic liquid crystal polyester (hereinafter referred to simply as "liquid crystal polyester") is aromatic polyester obtained, for example, by using aromatic hydroxycarboxylic acid as an essential monomer to react with a monomer such as aromatic dicarboxylic acid or aromatic diol, and exhibits liquid crystallinity when melted. Typical examples thereof include type I (see formula (1) below) synthesized from parahydroxy benzoic acid (PHB), phthalic acid, and 4,4'-biphenol, type II (see formula (2) below) synthesized from PHB and 2,6-hydroxynaphthoic acid, and type III (see formula (3) below) synthesized from PHB, terephthalic acid and ethylene glycol.

melt processing of the liquid crystal polymer. Introducing such an orientation mitigating filler, for example, smoothens a surface of the liquid crystal polymer film after being extruded, and also facilitates achievement of uniform orientation and isotropy. In addition, a coloring filler may be added to control a color tone of the liquid crystal polymer film.

A thermal linear expansion coefficient in a plane direction of such a liquid crystal polymer film is preferably from 3 ppm/° C. to 30 ppm/° C. If there is a large difference between the thermal linear expansion coefficient of the liquid crystal polymer film and a thermal linear expansion coefficient of the surface-treated copper foil, warping tends to occur on the copper-clad laminate. Therefore, substantially matching the thermal linear expansion coefficient of the liquid crystal polymer film with that of the surface-treated copper foil can suppress the occurrence of warping.

It is generally known that since molecules of liquid crystal polymer are rigid and have a long chemical structure, they are extremely easy to orient. An isotropic film in which the molecules of liquid crystal polymer are oriented in a specific direction is easily torn in the oriented direction, and therefore is difficult to handle. Additionally, the isotropic film is poor in dimensional accuracy, and exhibits large variations in thermal stress, mechanical strength, relative permittivity, and the like. Furthermore, when laminating a surface-treated copper foil on the anisotropic film to manufacture a copper-clad laminate, warping caused by the anisotropy of the film occurs on the copper-clad laminate, due to which the film cannot be used as the resin base material for a circuit board.

Accordingly, preferably, in a liquid crystal polymer film for use as the resin base material for a circuit board,

[Chem 1]

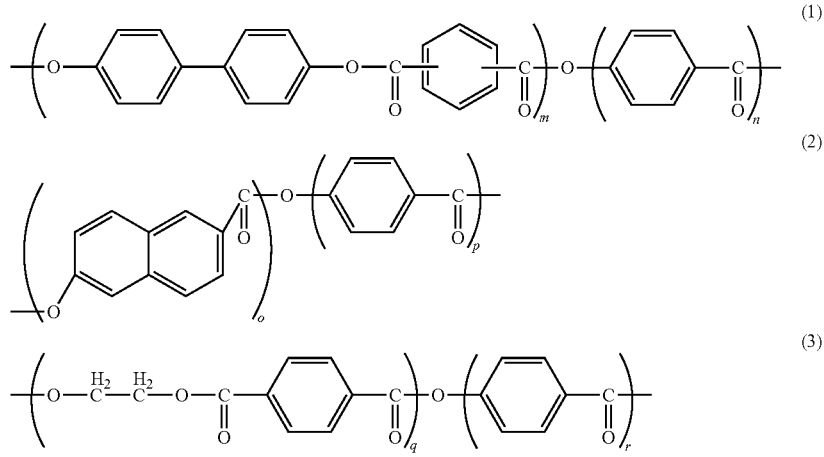

In the present embodiment, liquid crystal polyester of type I and liquid crystal polyester of type II are preferable among them because of higher heat resistance and higher hydrolysis resistance thereof. Additionally, the phthalic acid in the above formula (1) is preferably isophthalic acid.

The liquid crystal polymer film used in the present embodiment is preferably substantially composed of only liquid crystal polymer because of dielectric characteristics thereof and the like. On the other hand, liquid crystal polymer exhibits strong anisotropy when subjected to shear stress, and therefore a filler may be added as needed to mitigate molecular orientation anisotropy that occurs during molecular orientation thereof is controlled to be isotropic. Specifically, a ratio of a maximum value to a minimum value of thermal linear expansion coefficients in the plane direction is preferably from 1.0 to 2.5. The ratio is more preferably 2.0 or less, still more preferably 1.8 or less, and particularly preferably 1.5 or less. Note that the respective minimum and maximum values of the thermal linear expansion coefficients are set by measuring a thermal linear expansion coefficient at six points at intervals of 30° in a circumferential direction on the plane of the liquid crystal polymer film and obtaining a minimum value and a maximum value among the measured values.

Adjusting the thermal linear expansion coefficient and the ratio of the maximum value to the minimum value of the thermal linear expansion coefficients in the plane direction within the above ranges can more reliably reduce anisotropies of thermal stress, mechanical strength, and relative permittivity in the plane direction.

In general, liquid crystal polymer films have excellent dielectric characteristics. Specifically, when measured at a frequency of 3 GHz, the dielectric loss tangent is preferably 0.0035 or less, and more preferably 0.003 or less, and still preferably, the relative permittivity is 3.5 or less. Note that when an AC electric signal propagates to a circuit formed on a resin base material that is a dielectric, a part of electric power of the signal is absorbed by the dielectric, and thereby the signal tends to be attenuated or lost. A ratio between the electric power absorbed and the electric power that has passed (propagated) at that time is defined as dielectric loss tangent, and transmission loss can be reduced in a circuit using a dielectric having a small dielectric loss tangent.

Since liquid crystal polymer is thermoplastic, the copper-clad laminate according to the present embodiment can be easily manufactured by laminating the surface-treated copper foil on one surface or both surfaces of the liquid crystal polymer film and then heat pressing. The heat pressing can be performed by a conventionally known method using a vacuum press machine, a roll press machine, a double belt press machine, or the like. Conditions of the heat pressing may be adjusted as appropriate. For example, in the case of vacuum pressing, a temperature of from 200° C. to 350° C., a pressure of from 1 MPa to 10 MPa, and a pressing time of from 1 minute to 2 hours may be set.

The circuit board of the present embodiment is preferably formed using the copper-clad laminate described above. Such a circuit board of the present embodiment can be formed by a known method.

Additionally, the circuit board can be manufactured by chemically etching a part of the surface-treated copper foil of the copper-clad laminate by a conventional method to form a desired circuit pattern. In addition, as is obvious, electronic circuit components can be mounted on the circuit pattern. The electronic circuit components are not particularly limited as long as they are ones that are mounted on an electronic circuit board, and examples thereof include, besides stand-alone semiconductor elements, chip resistors, chip capacitors, and semiconductor packages (PKGs).

EXAMPLES

Hereinafter, Examples and Comparative Examples will be illustrated to describe the present invention more specifically. First, using a sulfuric acid-copper sulfate aqueous solution as an electrolytic solution, an electrolytic copper foil having a thickness of 12 μm was manufactured by the following operation. Specifically, the electrolytic solution was supplied between an anode and a cathode drum provided facing the anode, and DC current was applied between the anode and the cathode drum while rotating the cathode drum at a constant speed, as a result of which copper was precipitated on a surface of the cathode drum. Then, the precipitated copper was peeled off from the surface of the cathode drum and continuously wound to manufacture an electrolytic copper foil.

The electrolytic solution had a copper concentration of 80 g/L, a sulfuric acid concentration of 70 g/L, and a chlorine concentration of 25 mg/L. Additives added to the electrolytic solution were sodium 3-mercapto-1-propanesulfonate, hydroxyethyl cellulose, and low molecular weight glue (molecular weight: 3000), in which concentrations of the additives were 2 mg/L, 10 mg/L, and 50 mg/L in the listed order. Additionally, during manufacturing of the electrolytic copper foil, the electrolytic solution had a temperature of 55° C. and a current density of 45 A/dm$^2$.

A 10-point average roughness Rz of the obtained electrolytic copper foil was 1.3 μm. The 10-point average roughness Rz of the electrolytic copper foil was measured using a contact type surface roughness meter "SURF CODER SE1700" manufactured by Kosaka Laboratory Ltd.

Next, the electrolytic copper foil was subjected to a roughening treatment for roughening a surface thereof to manufacture a surface-treated copper foil. Specifically, electroplating for electrodepositing fine copper particles was performed as the roughening treatment on the surface of the electrolytic copper foil to obtain a roughened surface with fine irregularities formed by the copper particles.

Surface-treated copper foils of Examples 1 to 6 were subjected to roughening treatment 1 under conditions shown below. Additionally, surface-treated copper foils of Examples 7 to 12 were subjected to roughening treatment 2 under conditions shown below; surface-treated copper foils of Examples 13 to 21 were subjected to roughening treatment 3 under conditions shown below; and, surface-treated copper foils of Examples 22 to 30 were subjected to roughening treatment 4 under conditions shown below. The plating liquid for use in the electroplating contained copper, sulfuric acid, molybdenum, and scandium, and respective concentrations thereof are as follows.

(Roughening Treatment 1)
Copper sulfate concentration: 60 g/L as copper concentration
Sulfuric acid concentration: 150 g/L
Molybdenum compound concentration: from 2.0 to 3.0 g/L as molybdenum concentration
Scandium compound concentration: from 0.001 to 0.002 ppm as scandium concentration
Liquid temperature: from 15 to 30° C.
Current density: from 30 to 40 A/dm$^2$
Plating time: from 5 to 60 seconds (Roughening Treatment 2)
Copper sulfate concentration: 60 g/L as copper concentration
Sulfuric acid concentration: 150 g/L
Molybdenum compound concentration: from 3.0 to 4.0 g/L as molybdenum concentration
Scandium compound concentration: from 0.001 to 0.002 ppm as scandium concentration
Liquid temperature: from 15 to 30° C.
Current density: from 30 to 40 A/dm$^2$
Plating time: from 5 to 60 seconds (Roughening Treatment 3)
Copper sulfate concentration: 60 g/L as copper concentration
Sulfuric acid concentration: 150 g/L
Molybdenum compound concentration: from 2.0 to 3.0 g/L as molybdenum concentration
Scandium compound concentration: from 0.002 to 0.003 ppm as scandium concentration
Liquid temperature: from 15 to 30° C.
Current density: from 30 to 40 A/dm$^2$
Plating time: from 5 to 60 seconds (Roughening Treatment 4)
Copper sulfate concentration: 60 g/L as copper concentration
Sulfuric acid concentration: 150 g/L Molybdenum compound concentration: from 3.0 to 4.0 g/L as molybdenum concentration Scandium compound concentration: from 0.002 to 0.003 ppm as scandium concentration Liquid temperature: from 15 to 30° C.
Current density: from 30 to 40 A/dm$^2$
Plating time: from 5 to 60 seconds On the other hand, surface-treated copper foils of Comparative Examples 1 to 6 were subjected to roughening treatment 5 under conditions shown below, and surface-treated copper foils of Comparative Examples 7 to 11 were subjected to roughening treatment 6 under conditions shown below.

Additionally, a surface-treated copper foil of Comparative Example 12 was subjected to a roughening treatment described in Examples of PTL 1. In addition, surface-treated copper foils of Comparative Examples 13, 14, 15, and 16, respectively, were subjected to roughening plating processes A, B, C, and D described in Examples of PTL 2. Furthermore, surface-treated copper foils of Comparative Examples 17 to 22 were subjected to roughening treatment 7 under conditions shown below.

(Roughening Treatment 5)

Copper sulfate concentration: 60 g/L as copper concentration

Sulfuric acid concentration: 150 g/L

Molybdenum compound concentration: from 2.0 to 4.0 g/L as molybdenum concentration Scandium compound concentration: from 0 to 0.001 ppm as scandium concentration Liquid temperature: from 15 to 30° C.
Current density: from 30 to 40 A/dm$^2$
Plating time: from 5 to 60 seconds (Roughening Treatment 6)

Copper sulfate concentration: 60 g/L as copper concentration

Sulfuric acid concentration: 150 g/L

Molybdenum compound concentration: from 0 to 2.0 g/L as molybdenum concentration Scandium compound concentration: from 0.001 to 0.004 ppm as scandium concentration Liquid temperature: from 15 to 30° C.
Current density: from 30 to 40 A/dm$^2$
Plating time: from 5 to 60 seconds (Roughening Treatment 7)

Copper sulfate concentration: 60 g/L as copper concentration

Sulfuric acid concentration: 150 g/L

Molybdenum compound concentration: from 2.0 to 4.0 g/L as molybdenum concentration Scandium compound concentration: from 0.004 to 0.005 ppm as scandium concentration Liquid temperature: from 15 to 30° C.
Current density: from 30 to 40 A/dm$^2$
Plating time: from 5 to 60 seconds Next, as a fixing treatment for preventing the copper particles from falling off from the roughened surface, copper plating was performed on the roughened surface. In Examples 1 to 30, Comparative Examples 1 to 11, and Comparative Examples 17 to 22, the fixing treatment was performed under conditions shown below. Note that, in Comparative Example 12, the roughening treatment described in Examples of PTL 1 included a fixing treatment, and in Comparative Examples 13 to 16, the respective roughening plating processes A, B, C, and D described in the Examples of PTL 2 included a fixing treatment, so that no additional copper plating was performed.

(Fixing Treatment)

Copper sulfate concentration: 80 g/L as copper concentration

Sulfuric acid concentration: 120 g/L

Liquid temperature: from 20 to 30° C.
Current density: from 1.5 to 4 A/dm$^2$
Plating time: from 5 to 60 seconds Furthermore, after the fixing treatment, nickel plating, zinc plating, and chrome plating were additionally performed in this order. A plating liquid for use in the nickel plating contained nickel and boric acid ($H_3BO_3$), and had a nickel concentration of 40 g/L and a boric acid concentration of 5 g/L. In addition, the plating liquid had a temperature of 20° C., a pH of 3.6, and a current density of 0.2 A/dm$^2$, and the plating time was 10 seconds.

A plating liquid for use in the zinc plating contained zinc and sodium hydroxide, and had a zinc concentration of 2.5 g/L and a sodium hydroxide concentration of 40 g/L. In addition, the plating liquid has a temperature of 20° C., a current density of 0.3 A/dm$^2$, and the plating time was 5 seconds.

A plating liquid for use in the chrome plating contained chromium, and had a chromium concentration of 5 g/L. In addition, the plating liquid had a temperature of 30° C., a pH of 2.2, and a current density of 5 A/dm$^2$, and the plating time was 5 seconds.

[Method for Measuring Surface Skewness Ssk and Arithmetic Mean Summit Curvature Ssc of Copper Foil Roughened Surface]

Using a white light interferometer Contour GT-X (Model: 831-567-1) manufactured by Bruker Co., the surface skewness Ssk and arithmetic mean summit curvature Ssc of the roughened surface of the surface-treated copper foil were measured.

Specifically, a VSI/VXI mode was selected at an internal lens magnification of 1× and an objective lens magnification of 50×, and Terms Removal (F-Operator, Cylinder and Tilt), Data Restore (Method: Legacy, Interactions: 5, Restore Edge: not selected), Fourier Filter (Fourier Filter Window: Gaussian, High Freq Pass, Frequency Cutoff: 62.5 [1/mm]), and Statistic Filter were set in this order to perform filtering of measured values. Then, from among parameter groups listed in the 3D analysis, "S Parameters-Hybrid" was selected to measure the arithmetic mean summit curvature Ssc, and "S Parameters-Height" was selected to measure the surface skewness Ssk. The number of scans in a single measurement was three times, and an average value of numerical values obtained by the three scans was adopted as a measured value.

The surface-treated copper foils of Examples 1 to 30 and Comparative Examples 1 to 22, respectively, were manufactured in the manner described above. The surface-treated copper foils were all 12 µm in thickness. Tables 1 and 2 show conditions of the roughening treatment of each obtained surface-treated copper foil and various properties (surface skewness Ssk and arithmetic mean summit curvature Ssc) of the roughened surface thereof.

Next, evaluation was made on the obtained surface-treated copper foils of Examples 1 to 30 and Comparative Examples 1 to 22. Evaluation items were resin adhesion, laser processability, and the presence or absence of powder falling. Methods for evaluating the respective evaluation items will be described below.

[Method for Evaluating Resin Adhesion]

The surface-treated copper foil of each of Examples or Comparative Examples described above was laminated on one surface of a liquid crystal polymer film having a thickness of 50 μm (manufactured by Ise Murata Manufacturing Co., Ltd.; thickness accuracy: 0.7 μm, relative permittivity: 3.4, dielectric loss tangent: 0.0020, and the ratio of a maximum value to a minimum value of a thermal linear expansion coefficient: 1.4), and a polyimide film ("UPILEX 20S" manufactured by Ube Industries, Ltd.) was laminated as a release material on the other surface thereof.

The laminate was sandwiched between two stainless steel sheets having a thickness of 2 mm, then, furthermore, sandwiched between two stainless steel fiber woven fabrics having a thickness of 1 mm, which were cushioning materials, and held at a temperature of 300° C. under a pressure of 3 MPa for 5 minutes using a vacuum press machine to manufacture a single-sided copper-clad laminate.

The manufactured single-sided copper-clad laminate was installed in a tensile tester "AGS-H" manufactured by Shimazu Corporation, and the surface-treated copper foil was peeled off from the liquid crystal polymer film to measure a peel strength in accordance with a method defined in JIS C6471-1995.

Details of the method for measuring the peel strength are as follows. A masking tape having a width of 5 mm was attached to the surface-treated copper foil of the single-sided copper-clad laminate, and the laminate was immersed in a ferric chloride solution to remove an unnecessary part of the surface-treated copper foil by etching. Then, the single-sided copper-clad laminate was washed with water, and the masking tape was peeled off. The laminate was dried for 1 hour in a circulation oven kept at 80° C. to form a linear circuit pattern having a width of 5 mm on the single-sided copper-clad laminate.

The single-sided copper-clad laminate was attached to a reinforcing sheet having a thickness of 1 mm or more to prevent a peel angle from changing due to bending of the single-sided copper-clad laminate when peeling off the surface-treated copper foil from the single-sided copper-clad laminate. One end of the formed circuit pattern was peeled off from the single-sided copper-clad laminate, and sandwiched by a tensile tester. Then, the surface-treated copper foil was pulled by the tensile tester under conditions: a peel angle of 180° (an angle in a peeling direction with respect to a surface of the single-sided copper-clad laminate where the surface-treated copper foil is removed was 180°) and a tensile speed of 50 mm/min, and was peeled off by 10 mm or more from the single-sided copper-clad laminate to calculate an average strength value during the peeling, in which the value was used as a peel strength.

Then, when the peel strength was 0.80 N/mm or more, it was rated as extremely excellent in resin adhesion, and indicated by mark "⊚" in Tables 1 and 2. Additionally, when the peel strength was from 0.60 N/mm to less than 0.80 N/mm, it was rated as excellent in resin adhesion, and indicated by mark "○" in Tables 1 and 2. In addition, when the peel strength was from 0.5 N/mm to less than 0.60 N/mm, it was rated as slightly poor in resin adhesion, and indicated by mark "Δ" in Tables 1 and 2. Furthermore, when the peel strength was less than 0.5 N/mm, it was rated as poor in resin adhesion, and indicated by mark "X" in Tables 1 and 2.

[Method for Evaluating Laser Processability]

The surface-treated copper foil of each of Examples or Comparative Examples described above was bonded to one surface of a liquid crystal polymer film having a thickness of 50 μm (manufactured by Ise Murata Manufacturing Co., Ltd.; relative permittivity: 3.4, dielectric loss tangent: 0.0020, and the ratio of a maximum value to a minimum value of the thermal linear expansion coefficient: 1.4) by the same method as the method described above to manufacture a single-sided copper-clad laminate. In this case, the liquid crystal polymer film was bonded to the roughened surface of the surface-treated copper foil.

Next, the liquid crystal polymer film of the single-sided copper-clad laminate manufactured as described above was irradiated with carbon dioxide laser light to form 100 via holes at optional positions. Note that the irradiation of the carbon dioxide gas laser light was performed under conditions: a pulse width of from 1 to 5 μs, a tip energy of from 1 to 3 mJ, a mask diameter of from 1 to 3 mm, and the number of irradiation shots of from 5 to 10 shots. Additionally, the formed via holes had a diameter of 100 μm.

A bottom surface of each via hole of the single-sided copper-clad laminate was observed using a scanning electron microscope. An acceleration voltage of the scanning electron microscope was set to 3 kV. In the obtained image, high brightness portions indicated exposed tips of the roughened particles, whereas low brightness portions indicated exposed bottoms of valley structures between the roughened particles, both of which were portions without any remaining liquid crystal polymer. Intermediate brightness portions indicated portions where the liquid crystal polymer remained in such a manner as to surround the portions between the roughened particles and the tips of the roughened particles.

Thus, a brightness/lightness distribution of the obtained image was created. Portions corresponding to a brightness range whose lower limit was a brightness internally dividing a mode value and a minimum value at 1:2 and whose upper limit was a brightness internally dividing the mode value and a maximum value at 1:2 were regarded as portions with the remaining liquid crystal polymer on the bottom surface of the via hole, and a proportion (area ratio) of the portions with the remaining liquid crystal polymer was calculated. Image analysis used an image analysis software ImageJ. It can be said that the smaller the proportion of the portions with the remaining liquid crystal polymer, the better the laser processability.

Then, when the proportion of those with the remaining liquid crystal polymer on the bottom surface of the via hole was less than 40 areas, it was rated as extremely excellent in laser processability, and indicated by mark "⊚" in Tables 1 and 2. Additionally, when the proportion of those with the remaining liquid crystal polymer on the bottom surface of the via hole was from 40 area % to less than 70 area %, it was rated as excellent in laser processability, and indicated by mark "○" in Tables 1 and 2. Furthermore, when the proportion of those with the remaining liquid crystal polymer on the bottom surface of the via hole was 70 area % or more, it was rated as poor in laser processability, and indicated by mark "X" in Tables 1 and 2.

[Powder Falling Test]

Test paper (Grade 2 filter paper) having a width of 30 mm and a length of 100 mm was placed on the roughened surface of each of the surface-treated copper foils of Examples or Comparative Examples described above, and furthermore, a weight having a mass of 200 g and a bottom surface diameter of 30 mm was placed on the test paper. Then, after the test paper was horizontally pulled and dragged by 120 mm, the presence or absence of adhesion of copper particle powder to the test paper was visually checked. When the adhesion of the copper particle powder was not found, it was rated as no powder falling, and indicated by mark "OK" in Tables 1 and 2, whereas when the adhesion of the copper particle powder was found, it was rated as powder falling, and indicated by mark "NG" in Tables 1 and 2.

TABLE 1

| | Conditions of roughening treatment | | | | | | | Properties | | |
|---|---|---|---|---|---|---|---|---|---|---|
| | Mo concentration (g/L) | Sc concentration (ppm) | Liquid temperature (° C.) | Current density (A/dm²) | Plating time (sec.) | Ssk | Ssc (nm⁻¹) | Laser processability | Resin adhesion | Powder falling |
| Ex. 1 | 2.1 | 0.0014 | 18 | 32 | 17 | −0.003 | 0.0222 | ○ | ○ | OK |
| Ex. 2 | 2.9 | 0.0016 | 30 | 40 | 5 | −0.006 | 0.0234 | ○ | ○ | OK |
| Ex. 3 | 2.4 | 0.0012 | 24 | 30 | 60 | −0.009 | 0.0247 | ○ | ○ | OK |
| Ex. 4 | 2.5 | 0.0019 | 27 | 35 | 22 | −0.095 | 0.0221 | ○ | ○ | OK |
| Ex. 5 | 2.8 | 0.0011 | 21 | 34 | 42 | −0.092 | 0.0236 | ○ | ○ | OK |
| Ex. 6 | 2.3 | 0.0015 | 15 | 38 | 59 | −0.089 | 0.0249 | ○ | ○ | OK |
| Ex. 7 | 3.4 | 0.0015 | 20 | 30 | 41 | −0.012 | 0.0252 | ○ | ◎ | OK |
| Ex. 8 | 3.1 | 0.0018 | 15 | 40 | 5 | −0.011 | 0.0276 | ○ | ◎ | OK |
| Ex. 9 | 3.6 | 0.0011 | 30 | 32 | 29 | −0.006 | 0.0296 | ○ | ◎ | OK |
| Ex. 10 | 3.9 | 0.0014 | 19 | 33 | 60 | −0.092 | 0.0253 | ○ | ◎ | OK |
| Ex. 11 | 3.2 | 0.0013 | 22 | 35 | 13 | −0.096 | 0.0273 | ○ | ◎ | OK |
| Ex. 12 | 3.5 | 0.0019 | 24 | 38 | 30 | −0.089 | 0.0298 | ○ | ◎ | OK |
| Ex. 13 | 2.3 | 0.0024 | 15 | 34 | 22 | −0.110 | 0.0221 | ◎ | ○ | OK |
| Ex. 14 | 2.5 | 0.0027 | 23 | 37 | 19 | −0.105 | 0.0233 | ◎ | ○ | OK |
| Ex. 15 | 2.2 | 0.0021 | 23 | 33 | 27 | −0.108 | 0.0246 | ◎ | ○ | OK |
| Ex. 16 | 2.5 | 0.0022 | 21 | 30 | 5 | −0.206 | 0.0222 | ◎ | ○ | OK |
| Ex. 17 | 2.4 | 0.0029 | 19 | 32 | 12 | −0.199 | 0.0234 | ◎ | ○ | OK |
| Ex. 18 | 2.1 | 0.0026 | 18 | 40 | 53 | −0.210 | 0.0248 | ◎ | ○ | OK |
| Ex. 19 | 2.6 | 0.0025 | 25 | 36 | 23 | −0.288 | 0.0222 | ◎ | ○ | OK |
| Ex. 20 | 2.9 | 0.0023 | 30 | 32 | 60 | −0.294 | 0.0235 | ◎ | ○ | OK |
| Ex. 21 | 2.3 | 0.0028 | 26 | 33 | 31 | −0.291 | 0.0248 | ◎ | ○ | OK |
| Ex. 22 | 3.2 | 0.0025 | 15 | 37 | 30 | −0.107 | 0.0251 | ◎ | ◎ | OK |
| Ex. 23 | 3.5 | 0.0028 | 30 | 30 | 8 | −0.114 | 0.0277 | ◎ | ◎ | OK |
| Ex. 24 | 3.1 | 0.0022 | 24 | 32 | 25 | −0.101 | 0.0298 | ◎ | ◎ | OK |
| Ex. 25 | 3.4 | 0.0024 | 30 | 40 | 60 | −0.202 | 0.0251 | ◎ | ◎ | OK |
| Ex. 26 | 3.7 | 0.0027 | 29 | 36 | 16 | −0.204 | 0.0278 | ◎ | ◎ | OK |
| Ex. 27 | 3.3 | 0.0021 | 23 | 34 | 52 | −0.198 | 0.0297 | ◎ | ◎ | OK |
| Ex. 28 | 3.9 | 0.0023 | 16 | 35 | 44 | −0.299 | 0.0253 | ◎ | ◎ | OK |
| Ex. 29 | 3.6 | 0.0026 | 19 | 33 | 5 | −0.285 | 0.0279 | ◎ | ◎ | OK |
| Ex. 30 | 3.8 | 0.0021 | 18 | 36 | 52 | −0.289 | 0.0299 | ◎ | ◎ | OK |

TABLE 2

| | Conditions of roughening treatment | | | | | | | Properties | | |
|---|---|---|---|---|---|---|---|---|---|---|
| | Mo concentration (g/L) | Sc concentration (ppm) | Liquid temperature (° C.) | Current density (A/dm²) | Plating time (sec.) | Ssk | Ssc (nm⁻¹) | Laser processability | Resin adhesion | Powder falling |
| Comp. Ex. 1 | 3.5 | 0.0005 | 25 | 36 | 5 | 0.002 | 0.0221 | X | ○ | OK |
| Comp. Ex. 2 | 2.1 | 0.0004 | 15 | 40 | 38 | 0.006 | 0.0236 | X | ○ | OK |
| Comp. Ex. 3 | 2.5 | 0.0001 | 23 | 33 | 54 | 0.004 | 0.0249 | X | ○ | OK |
| Comp. Ex. 4 | 3.7 | 0.0007 | 21 | 30 | 43 | 0.003 | 0.0252 | X | ◎ | OK |
| Comp. Ex. 5 | 3.4 | 0 | 24 | 37 | 30 | 0.005 | 0.0278 | X | ◎ | OK |
| Comp. Ex. 6 | 2.7 | 0.0006 | 30 | 33 | 60 | 0.001 | 0.0296 | X | ◎ | OK |
| Comp. Ex. 7 | 1.8 | 0.0027 | 26 | 37 | 5 | −0.002 | 0.0218 | ○ | X | OK |
| Comp. Ex. 8 | 0.5 | 0.0031 | 30 | 33 | 20 | −0.096 | 0.0217 | ○ | X | OK |
| Comp. Ex. 9 | 0 | 0.0020 | 19 | 35 | 37 | −0.102 | 0.0219 | ◎ | Δ | OK |
| Comp. Ex. 10 | 1.8 | 0.0011 | 23 | 32 | 16 | −0.203 | 0.0218 | ◎ | Δ | OK |
| Comp. Ex. 11 | 0.1 | 0.0039 | 15 | 35 | 60 | −0.295 | 0.0219 | ◎ | Δ | OK |
| Comp. Ex. 12 | Roughening treatment described in Exs. of PTL 1 | | | | | −0.001 | 0.0301 | ○ | ◎ | NG |
| Comp. Ex. 13 | Roughening treatment A described in Exs. of PTL 2 | | | | | −0.096 | 0.0302 | ○ | ◎ | NG |
| Comp. Ex. 14 | Roughening treatment B described in Exs. of PTL 2 | | | | | −0.102 | 0.0301 | ◎ | ◎ | NG |

TABLE 2-continued

| | Conditions of roughening treatment | | | | | | | Properties | | |
|---|---|---|---|---|---|---|---|---|---|---|
| | Mo concentration (g/L) | Sc concentration (ppm) | Liquid temperature (° C.) | Current density (A/dm$^2$) | Plating time (sec.) | Ssk | Ssc (nm$^{-1}$) | Laser processability | Resin adhesion | Powder falling |
| Comp. Ex. 15 | Roughening treatment C described in Exs. of PTL 2 | | | | | −0.202 | 0.0303 | ◎ | ◎ | NG |
| Comp. Ex. 16 | Roughening treatment D described in Exs. of PTL 2 | | | | | −0.298 | 0.0304 | ◎ | ◎ | NG |
| Comp. Ex. 17 | 2.3 | 0.0047 | 30 | 37 | 11 | −0.301 | 0.0222 | X | ◯ | OK |
| Comp. Ex. 18 | 2.1 | 0.0043 | 19 | 35 | 60 | −0.303 | 0.0234 | X | ◯ | OK |
| Comp. Ex. 19 | 3.1 | 0.0041 | 26 | 40 | 36 | −0.304 | 0.0248 | X | ◯ | OK |
| Comp. Ex. 20 | 2.3 | 0.0047 | 30 | 32 | 13 | −0.309 | 0.0251 | X | ◎ | OK |
| Comp. Ex. 21 | 3.9 | 0.0041 | 23 | 38 | 5 | −0.307 | 0.0279 | X | ◎ | OK |
| Comp. Ex. 22 | 3.3 | 0.0048 | 15 | 34 | 23 | −0.306 | 0.0297 | X | ◎ | OK |

As can be seen from Tables 1 and 2, the surface-treated copper foils of Examples 1 to 30 satisfied the requirements for the surface skewness Ssk and arithmetic mean summit curvature Ssc of the roughened surface, and therefore were excellent in all of laser processability, resin adhesion, and power fall-off.

On the other hand, the surface-treated copper foils of Comparative Examples 1 to 6 were poor in laser processability since the surface skewness Ssk of the roughened surface had a positive value exceeding 0. Additionally, the surface-treated copper foils of Comparative Examples 17 to 22 were poor in laser processability since the surface skewness Ssk of the roughened surface was less than −0.300.

Furthermore, the surface-treated copper foils of Comparative Examples 7 to 11 were poor in resin adhesion since the arithmetic mean summit curvature Ssc of the roughened surface was less than 0.0220 nm$^{-1}$. Still furthermore, the surface-treated copper foils of Comparative Examples 12 to 16 caused power falling since the arithmetic mean summit curvature Ssc of the roughened surface was 0.0300 nm$^{-1}$ or more.

The invention claimed is:

1. A surface-treated copper foil comprising a roughened surface formed by subjecting a surface to a roughening treatment, wherein when measured using a three-dimensional roughness meter, the roughened surface has a surface skewness Ssk within a range of from −0.300 to less than 0 and an arithmetic mean summit curvature Ssc within a range of from 0.0220 nm$^{-1}$ to less than 0.0300 nm$^{-1}$.

2. The surface-treated copper foil according to claim 1, wherein the roughened surface has a surface skewness Ssk within a range of from −0.300 to less than −0.100 and an arithmetic mean summit curvature Ssc within a range of from 0.0250 nm$^{-1}$ to less than 0.0300 nm$^{-1}$.

3. A copper-clad laminate comprising the surface-treated copper foil according to claim 1.

4. A copper-clad laminate comprising the surface-treated copper foil according to claim 2.

5. The copper-clad laminate according to claim 3, comprising the surface-treated copper foil and a resin base material laminated on the roughened surface of the surface-treated copper foil, the resin base material containing a liquid crystal polymer.

6. The copper-clad laminate according to claim 4, comprising the surface-treated copper foil and a resin base material laminated on the roughened surface of the surface-treated copper foil, the resin base material containing a liquid crystal polymer.

7. A circuit board comprising the copper-clad laminate according to claim 3.

8. A circuit board comprising the copper-clad laminate according to claim 4.

9. A circuit board comprising the copper-clad laminate according to claim 5.

10. A circuit board comprising the copper-clad laminate according to claim 6.

* * * * *